United States Patent [19]
Akram et al.

[11] Patent Number: 5,894,161
[45] Date of Patent: Apr. 13, 1999

[54] INTERCONNECT WITH PRESSURE SENSING MECHANISM FOR TESTING SEMICONDUCTOR WAFERS

[75] Inventors: Salman Akram, Boise; Warren M. Farnworth, Nampa, both of Id.

[73] Assignee: Micron Technology, Inc., Boise, Id.

[21] Appl. No.: 08/805,126

[22] Filed: Feb. 24, 1997

[51] Int. Cl.⁶ .............................. H01L 23/58; H01L 29/82
[52] U.S. Cl. .............................................. 257/48; 257/417
[58] Field of Search ...................... 29/25.35; 310/313 R, 310/313 A, 311; 257/48, 417

[56] References Cited

U.S. PATENT DOCUMENTS

| | | | |
|---|---|---|---|
| 4,801,452 | 1/1989 | Farnworth et al. | 257/797 |
| 5,326,428 | 7/1994 | Farnworth et al. | 156/654 |
| 5,419,807 | 5/1995 | Akram et al. | 156/647 |
| 5,432,372 | 7/1995 | Ohtani | 257/419 |
| 5,483,741 | 1/1996 | Akram et al. | 29/846 |
| 5,518,951 | 5/1996 | Paynter et al. | 437/79 |
| 5,536,961 | 7/1996 | Polla | 257/417 |
| 5,606,263 | 2/1997 | Yoshizawa et al. | 324/761 |
| 5,679,998 | 10/1997 | Toda | 310/313 R |
| 5,716,218 | 2/1998 | Farnworth et al. | 438/15 |

*Primary Examiner*—Brian Dutton
*Attorney, Agent, or Firm*—Stephen A. Gratton

[57] ABSTRACT

An interconnect for testing semiconductor wafers, and a method and system for testing wafers using the interconnect are provided. The interconnect includes a substrate with contact members configured to establish temporary electrical communication with contact locations (e.g., bond pads, test pads) on the wafer. For flat contact locations (e.g., thin film bond pads), the contact members comprise raised members with penetrating projections. For bumped contact locations (e.g., solder bumps), the contact members comprise indentations with a conductive layer. The interconnect also includes a pressure sensing mechanism for monitoring and controlling contact forces between the interconnect and wafer. In an illustrative embodiment the pressure sensing mechanism comprises a piezoresistive or piezoelectric layer and resistance measuring device.

26 Claims, 5 Drawing Sheets

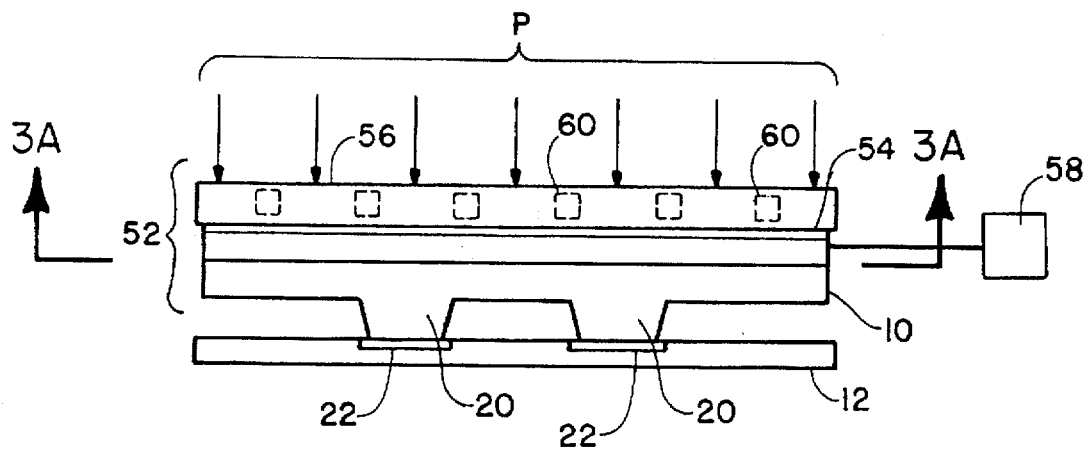
FIGURE 3
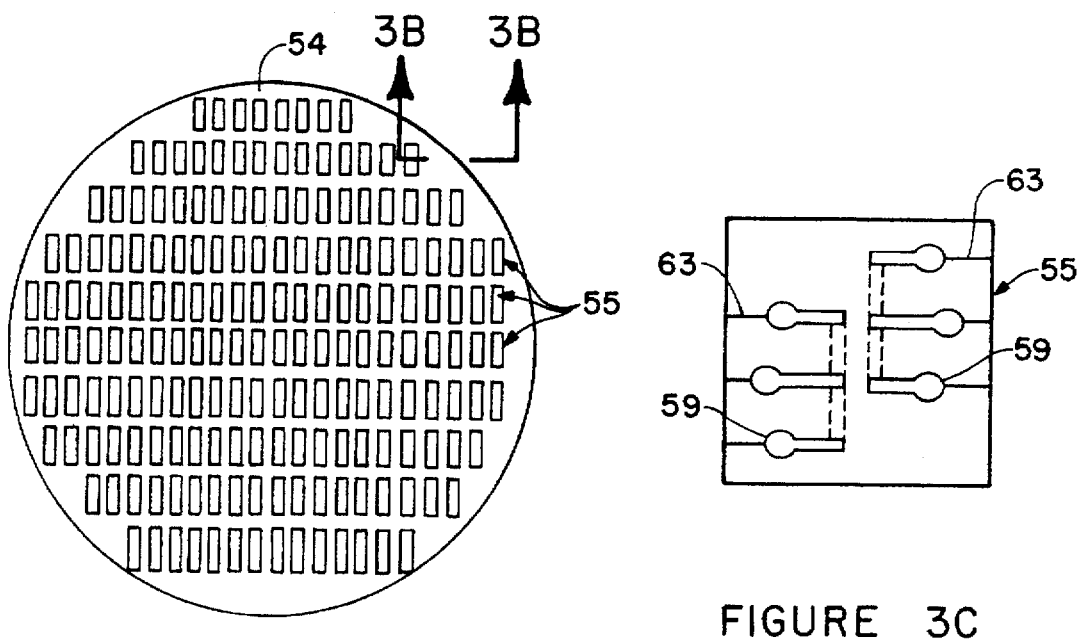
FIGURE 3A
FIGURE 3C
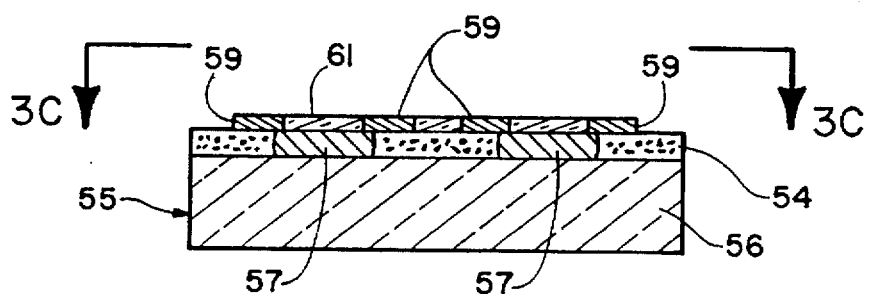
FIGURE 3B

INTERCONNECT WITH PRESSURE SENSING MECHANISM FOR TESTING SEMICONDUCTOR WAFERS

FIELD OF THE INVENTION

This invention relates generally to semiconductor manufacture and more particularly to an improved interconnect for semiconductor wafers, and to a test method and system that employ the interconnect.

BACKGROUND OF THE INVENTION

Semiconductor wafers must be tested during the manufacturing process to evaluate the electrical characteristics of the integrated circuits formed on the wafer. Standard tests for gross functionality are typically performed by probe testing the wafers using probe cards and wafer steppers. Other tests such as burn-in, and high speed testing are typically performed after the dice have been singulated and packaged. Among the tests performed are dynamic burn-in, input/output leakage, speed verification, opens, shorts, refresh and a range of algorithms to verify AC parameters.

In the past, burn-in and speed testing have been performed at the die level rather than at the wafer level. One reason that these test procedures are not performed at the wafer level is because the tests require interconnects with a large number of contact members and input/output paths to the wafer. For example, a wafer can include several hundred dice each having twenty or more bond pads. The total number of bond pads on the wafer can be in the thousands. For some tests procedures a contact member and input/output path must be provided to each bond pad. Even with wafer stepping techniques, conventionally formed interconnects, such as probe cards, usually do not include enough contact members (e.g., probes) to test dice having a large number of bond pads.

In addition to contact density limitations, force application and damage to the wafer must be minimized during the wafer testing procedure. In general, a large number of bond pads on the wafer will require that high contact forces be generated between the wafer and interconnect. The high contact forces can damage the wafer, particularly the bond pads that can have a thickness of only 1 μm or less. Damage to thin film metal bond pads can also result from the necessity to penetrate the metal oxide layer on the bond pads to make a good electrical connection.

It would be advantageous for an interconnect to include contact members capable of testing a wafer with a large number of bond pads. This would permit both gross functionality as well as burn-in, dynamic burn-in, and high speed tests to be performed at the wafer level. It would also be advantageous to test all of the dice on the wafer simultaneously so that wafer stepping techniques do not need to be employed. This would decrease the time for testing and improve wafer throughput. Still further, it would be advantageous to be able to control the amount of contact force exerted on the wafer by an interconnect in order to minimize damage to the wafer and bond pads. In view of the foregoing, the present invention is directed to an improved interconnect and method for testing semiconductor wafers.

SUMMARY OF THE INVENTION

In accordance with the invention, an improved interconnect, method and system for testing semiconductor wafers are provided. The interconnect comprises a substrate having integrally formed contact members for establishing temporary electrical communication with contact locations (e.g., bond pads, test pads) on the wafer. For wafers with flat contact locations, such as thin film bond pads, the contact members comprise raised members with penetrating projections adapted to penetrate the contact locations to a limited penetration depth. For wafers with bumped contact locations, such as solder bumps, the contact members comprise indentations adapted to retain the bumped contact locations.

The interconnect includes a pressure sensing mechanism mounted to the substrate and adapted to monitor the contact forces between the interconnect and wafer. The pressure sensing mechanism can include a piezoresistive or piezoelectric layer in electrical communication with a resistance measuring device. The resistance measuring device can be a Wheatstone bridge formed on the substrate or externally mounted to a testing apparatus. In addition, the piezoelectric or piezoresistive layer can be segmented, such that each die on the wafer has an associated pressure sensing segment. In an alternate embodiment, the pressure sensing mechanism includes pressure detectors, such as microsensors, mounted within a base.

The contact members on the substrate include conductive layers in electrical communication with conductors formed on the substrate. The conductors can be formed on different levels of the substrate (i.e., multi level conductors) to provide high speed conductive paths to dense arrays of contact members without cross talk and capacitive coupling between the conductors. In addition, the conductors can be formed in electrical communication with an edge connector formed on the substrate.

Preferably the interconnect substrate comprises silicon, such that a thermal coefficient of expansion (TCE) of the interconnect matches that of the wafer. With a silicon substrate, the raised contact members can be formed using a bulk micro machining process. In addition, an $SiO_2$ insulating layer can be formed on the substrate for electrically isolating the substrate from the contact members and conductors.

The indentation contact members can be formed on a silicon or a ceramic substrate. With a ceramic substrate the insulating layer is not required. In addition, concave depressions for the indentation contact members can be formed by laser ablating the substrate, and then depositing the conductive layers in the depressions.

The interconnect corresponds in size to the wafer being tested, and the contact members on the interconnect are formed in patterns that correspond to the patterns of the contact locations on the wafers. For some test procedures, such as dynamic burn-in and speed testing, the contact members can be configured to electrically contact every contact location (e.g., every bond pad) on the wafer. This permits an entire wafer to be tested without having to step the interconnect across the wafer. For other test procedures, such as static burn-in, the contact members can be configured to electrically contact only the Vss and Vcc contact locations on the wafer. Thus reduced contact forces are required between the wafer and interconnect, because fewer contact members are required.

BRIEF DESCRIPTION OF THE DRAWINGS

FIG. 2B is an enlarged cross sectional view equivalent to FIG. 2, but showing an alternate embodiment contact member for testing a bumped contact location on the wafer;

FIG. 3 is a schematic cross sectional view of the interconnect and pressure sensing mechanism;

FIG. 3A is a schematic cross sectional view taken along section line 3A—3A of FIG. 3;

FIG. 3B-1 is an enlarged schematic cross sectional view equivalent to FIG. 3B showing an alternate embodiment pressure sensing segment;

FIG. 3C-1 is an enlarged schematic cross sectional view equivalent to FIG. 3C of the alternate embodiment pressure sensing segment;

DETAILED DESCRIPTION OF THE PREFERRED EMBODIMENTS

Figures 1, 3B:
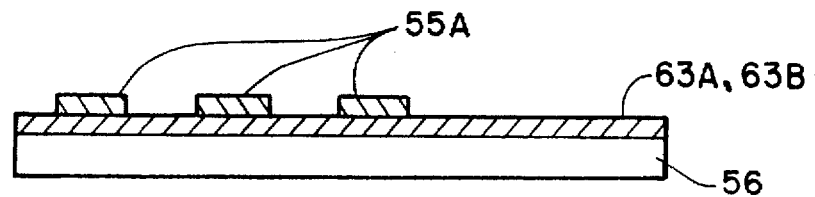
FIG. 1 is a perspective view of a semiconductor wafer and an interconnect constructed in accordance with the invention for testing the wafer.
FIG. 3B is an enlarged schematic cross sectional view taken along section line 3B—3B of FIG. 3A showing a pressure sensing segment for a piezoresistive layer of the pressure sensing mechanism.

Referring to FIG. 1, an interconnect 10 constructed in accordance with the invention is shown. The interconnect 10 is configured to physically contact and make temporary electrical connections with a semiconductor wafer 12 for testing. The wafer 12 comprises a standard wafer formed with semiconductor dice 14 and a major flat 16.

The interconnect 10 includes an interconnect substrate 18 and patterns of contact members 20. The interconnect 10 also includes a pressure sensing mechanism 52 mounted to a backside of the interconnect substrate 18. The pressure sensing mechanism 52 can be configured to monitor and control contact forces between the interconnect 10 and the wafer 12. The structure and function of the pressure sensing mechanism 52 will become more apparent as the description proceeds.

As shown in FIG. 1, the contact members 20 are formed on the substrate 18 in patterns that match the patterns of contact locations 22 (FIG. 2) on the wafer 12. Typically, the contact locations 22 will be bond pads on the dice 14 but can also be dedicated test pads at other locations on the wafer 12. The dice 14 can include a passivation layer 24 (FIG. 2) wherein the contact locations 22 are embedded.

As also shown in FIG. 1, the contact members 20 on the interconnect 10 are formed in electrical communication with patterns of conductors 26. The conductors 26 are in electrical communication with connection pads 28 formed along an outer peripheral edge of the interconnect 10. The connection pads 28 can be configured to form a male or female edge connector 30 in a standard electrical configuration. The edge connector 30 can be configured for connection to a mating electrical connector 32 in electrical communication with testing circuitry 33. The electrical connector 32 and testing circuitry 33 can be components of a testing apparatus 48 (FIG. 4) configured to support and bias the wafer 12 and interconnect 10 together during a test procedure. The testing apparatus 48 can be a conventional wafer handler modified for use with the interconnect 10.

Figure 2:
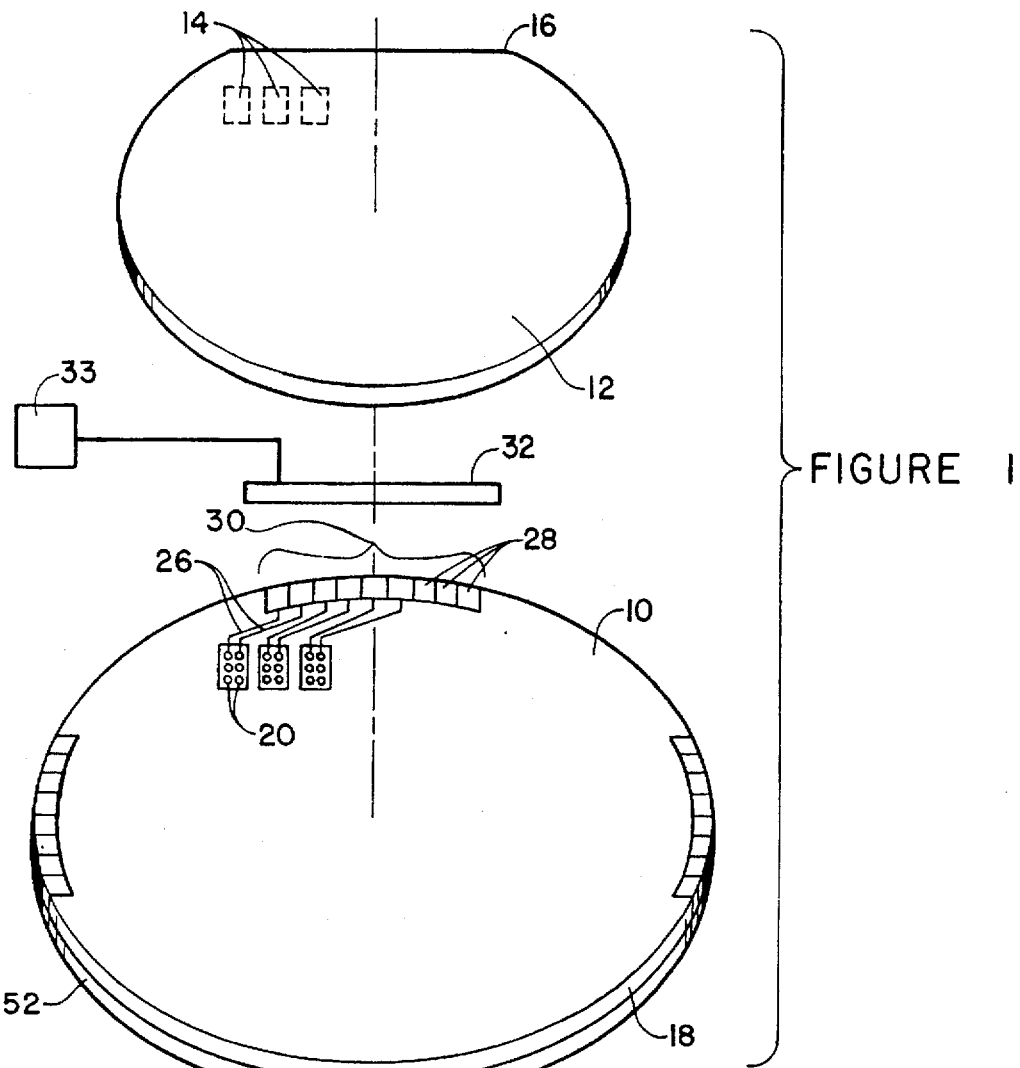
FIG. 2 is an enlarged cross sectional view taken through a contact member on the interconnect and a contact location on the wafer showing the temporary electrical connection therebetween.
Figure 2:
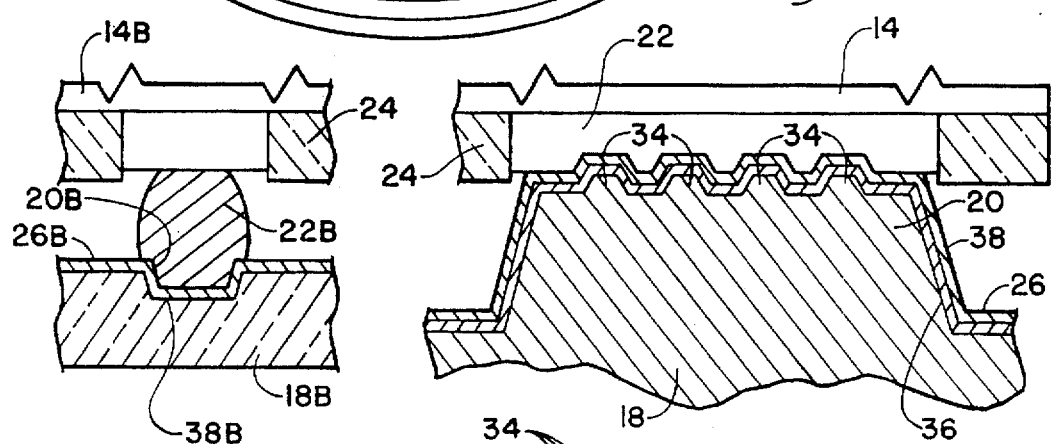
Figure 2A:
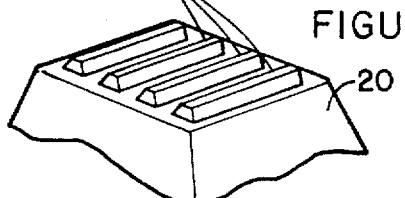
FIG. 2A is an enlarged perspective view of the contact member shown in FIG. 2.

Referring to FIGS. 2 and 2A, the construction of the contact members 20 is shown in more detail. The contact members 20 can include penetrating projections 34 configured to penetrate into the contact locations 22 on the dice 14 to a self limiting penetration depth. As will be further explained, the contact members 20 and penetrating projections 34 can be formed integrally on the interconnect substrate 18 using a semiconductor fabrication process such as bulk micromachining. Such a process permits the contact members 20 to be formed accurately in a dense array.

Each contact member 20 includes an insulating layer 36 and a conductive layer 38. As will be further explained, with the interconnect substrate 18 formed of silicon, the insulating layer 36 can be a grown or deposited oxide such as $SiO_2$.

The conductive layers 38 for all of the contact members 20 can be formed of a metal layer deposited and patterned to cover the contact members 20, or other selected areas of the substrate 18. By way of example, the conductive layers 38 for the contact members 20 can be formed of aluminum, copper, titanium, tungsten, tantalum, platinum, molybdenum, cobalt, nickel, gold, iridium or alloys of these metals. The conductive layers 38 can also be a metal silicide or a conductive material such as polysilicon. In addition, the conductive layers 38 can be formed as a bi-metal stack comprising a base layer and an oxidation resistant outer layer such as gold or platinum.

The conductive layers 38 can be formed using a metallization process comprising deposition (e.g., CVD), followed by photo patterning and etching. The conductive layer 38 for each contact member 20 is in electrical communication with a corresponding conductor 26 (FIG. 1) formed on the interconnect substrate 18. The conductive layers 38 and conductors 26 can be formed at the same time using the same metallization process. Alternately, the conductive layers 38 can be formed of a different metal than the conductors 26 using a separate metallization process. The connection pads 28 (FIG. 1) for the conductors 26 can also be formed using the same or a different metallization process. The connection pads 28 can also be a component of a standard electrical connector attached to the substrate 18.

Still referring to FIG. 2, with the interconnect 10 and wafer 12 biased together by the testing apparatus 48 (FIG. 4), the penetrating projections 34 on the contact members 20 penetrate into the contact locations 22 on the dice 14 and pierce any native oxide present to establish a temporary electrical connection therewith. However, the penetration depth of the projections 34 is limited by the stop plane provided by the top surface of the contact member 20. This limited penetration depth helps to prevent damage to the contact locations 22. In addition, the separation between the interconnect 10 and wafer 12 provided by the raised contact members 20 helps to clear any particulate matter present on the interconnect 10 or the wafer 12. As clearly shown in FIG. 2A, the penetrating projections 34 can be formed as elongated blades such that the test current is spread out over a larger area. From one to several penetrating projections 34 can be formed on each contact member 20. In addition, the penetrating projections 34 can be formed in a parallel spaced array as shown, or in different patterns (e.g., cross, circular, T-shape).

The raised contact members 20 and penetrating projections 34 are configured for use with contact locations 22 formed as thin film metal pads. For example, thin film bond pads on semiconductor dice 14 are typically aluminum layers about 1.0–1.5 μm thick. The projections 34 can be formed to penetrate yet not excessively damage thin film bond pads.

As shown in FIG. 2B, an alternate embodiment interconnect can be configured with indentation contact members 20B for making electrical connections to a wafer with bumped contact locations 22B. The bumped contact locations 22B will typically be solder bumps. Conventionally formed solder bumps on a bumped die 14B have a diameter of from 5 mils to 60 mils. Accordingly, the indentation contact members 20B can also be formed in this size range. For testing bumped dice 14B, the substrate 18B can be formed of either silicon or ceramic. With a ceramic substrate an insulating layer 36 (FIG. 2) is not required because the ceramic is electrically insulating. The indentation contact members 20B can be formed by etching or laser ablating concave depressions in the substrate 18B, and then forming conductive layers 38B on the depressions substantially as previously described for conductive layers 38. The conductive layers 38B for the indentation contact members 20B can be formed in electrical communication with corresponding conductors 26B as previously described.

Pressure Sensing Mechanism

Referring to FIG. 3, the pressure sensing mechanism 52 is shown in greater detail. The pressure sensing mechanism 52 comprises a base 56 having a piezoresistive sensing layer 54 formed thereon. Signals from the piezoresistive sensing layer 54 can be analyzed by a controller 58 and equated to the magnitude of the pressure P exerted by the testing apparatus 48 (FIG. 4) and to the contact forces between the contact members 20 and contact locations 22. In addition, the controller 58 can be configured to control the amount of pressure P or to provide feedback to the testing apparatus 48 for controlling the amount of pressure P.

The base 56 for the pressure sensing mechanism 52 can be formed of an electrically insulating material such as ceramic. The base 56 is configured to evenly apply a pressure (P) exerted by the testing apparatus 48 (FIG. 4), across the backside of the interconnect 10. The base 56 and piezoresistive sensing layer 54 can be attached to a backside of the interconnect 10 with an adhesive or merely placed in contact with the backside.

Figure 4:
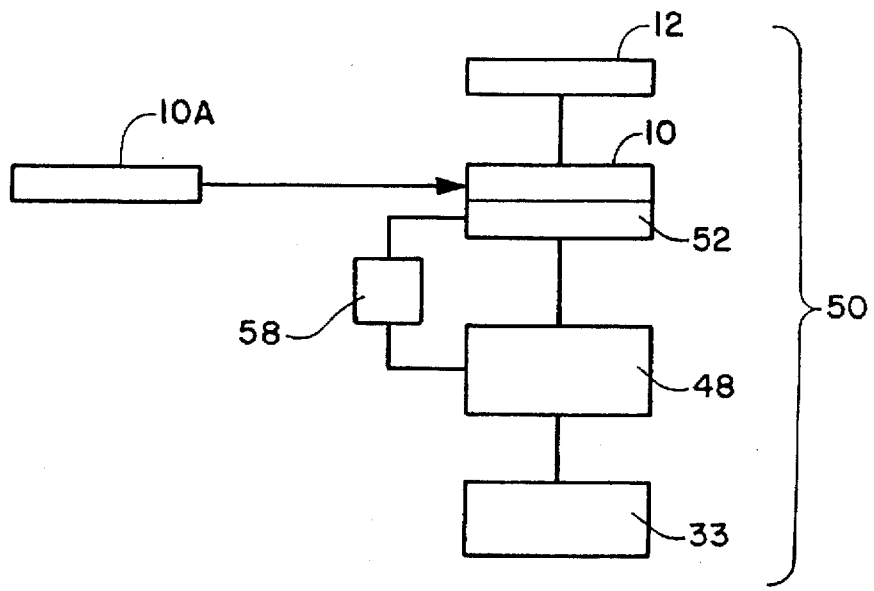
FIG. 4 is a schematic diagram of a system for testing a semiconductor wafer in accordance with the invention.

As shown in FIG. 3A, the piezoresistive sensing layer 54 includes a plurality of piezoresistive pressure sensing segments 55. Each pattern of contact members 20 on the interconnect 10 has an associated pressure sensing segment 55. Information received from a particular sensing segment 55 can be equated to the contact force between a particular die 14 (FIG. 1) on the wafer 12 and a particular pattern of contact members 20 on the interconnect 10. In addition, this information can be used to adjust the pressure P exerted by the testing apparatus 48 (FIG. 4). Optimally, the pressure P can be maintained at as low a level as possible to make good electrical connections yet prevent damage to the wafer 12.

Referring to FIG. 3B, a cross section through the piezoresistive sensing layer 54 and a piezoresistive sensing segment 55 is shown. The piezoresistive sensing layer 54 can comprise a semiconductor material such as doped amorphous or polycrystalline silicon. The piezoresistive sensing layer 54 can be formed on the base 56 using a suitable deposition process such as PECVD. With a silicon layer, the "as deposited" piezoresistive sensing layer 54 is highly resistive. However, portions of the piezoresistive sensing layer 54 can be annealed to lower the resistivity of the silicon and form individual piezoresistive sensor gauges 57. One suitable process for annealing the piezoresistive sensing layer 54 to form the sensor gauges 57 is with a laser and mask. This process allows the sensor gauges 57 to be accurately placed in desired locations.

Figures 1, 3C:
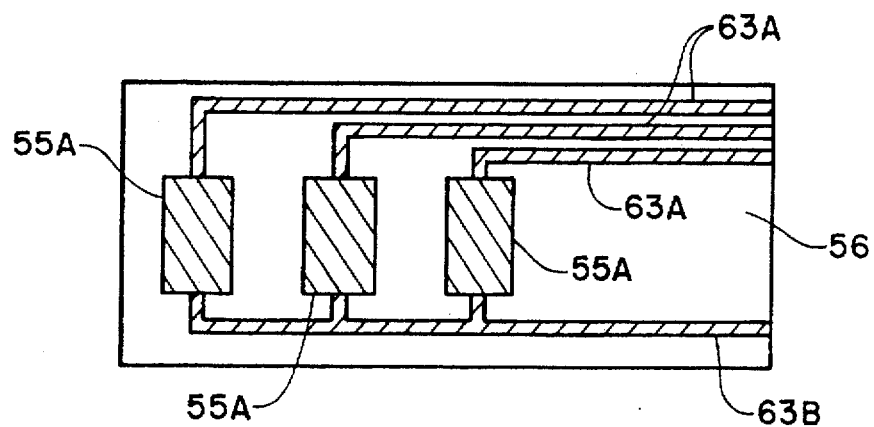
FIG. 3C is an enlarged schematic cross sectional view taken along section line 3C—3C of FIG. 3B.

The individual sensor gauges 57 are in electrical contact with metal contacts 59 embedded in an insulating layer 61. The metal contacts 59 and insulating layer 61 can be formed using suitable thin film deposition processes prior to the annealing step for forming the sensor gauges 57. In addition, as shown in FIG. 3C, the metal contacts 59 can be located in a pattern to form a resistance measuring device, such as a Wheatstone bridge. Still further, the metal contacts 59 can be formed in electrical communication with a pattern of conductive traces 63 in electrical communication with the controller 58. The conductive traces 63 can be formed on the base 56 using a suitable metallization process (e.g., deposition, photopatterning, etching).

The individual sensor gauges 57 (FIG. 3B) have an electrical resistance that changes as they are subjected to strain during operation of the interconnect 10. This change in electrical resistance can be measured using the resistance measuring device (FIG. 3C) and controller 58 and equated to the contact force between the contact members 20 and contact locations 22. This information can then be used by the controller 58 to monitor the test process and to adjust the force P being exerted by the testing apparatus 48 on the interconnect 10.

These relationships stated mathematically are as follows.

P α to R, where R is the resistivity of the sensor gauges 57,

R=V/I where V is the voltage and I is the current, therefore

P=a (V/I) where a is a constant of proportionality,

Since a and V can be predetermined, a change in I gives us the pressure P.

In an alternate embodiment illustrated in FIGS. 3B-1 and 3C-1, the resistance measuring device (e.g., Wheatstone bridge) is located external to the pressure sensing mechanism 52. For example, the resistance measuring device can be included in the testing apparatus 48 (FIG. 4). In this embodiment, the piezoresistive sensing segments 55A are formed of a resistive polymer deposited on the base 56 and patterned as required. Each sensing segment 55A is in electrical communication with sense side conductive traces 63A and supply side conductive traces 63B. Pressure on the piezoresistive sensing segments 55A changes the resistance of the segments 55A which can be detected and equated to the pressure P (FIG. 3).

The pressure sensing mechanism 52 rather than being formed with a piezoresistive layer can also be formed of other elements in which a change of resistance as a function of pressure can be measured. For example, in place of a piezoresistive sensing layer 54 (FIG. 3), the base 56 can include microsensors 60 (FIG. 3) fabricated using integrated circuit and micromachining technologies. The microsensors can comprise piezoresistors or internal pressure detectors such as gas filled bladders, strain gauges or spring constant materials. The microsensors 60 can be operably associated with suitable controllers. The information from these sensors 60 can be equated to the contact forces between the contact members and wafer and used to control the contact force substantially as previously described.

System

Referring to FIG. 4, a schematic block diagram of a system 50 for testing semiconductor wafers in accordance with the invention is shown. The system 50 includes the testing apparatus 48 which is configured to support the wafer 12 and the interconnect 10, and to bias the wafer 12 and interconnect 10 together with a desired contact force therebetween. The testing apparatus 48 can be a conventional wafer probe apparatus or wafer handler. Suitable testing apparatus are manufactured by Teradyne and Electroglass. The testing apparatus 48 is in electrical communication with the test circuitry 33 via a suitable conductive path.

The testing apparatus 48 is adapted to align the interconnect 10 and wafer 12 prior to biasing the contact members 20 (FIG. 2) into contact with the contact locations 22 (FIG. 2). Alignment can be effected using split optics or other suitable optical alignment system operably associated with the testing apparatus 48.

During the testing procedure and as shown in FIG. 2, the penetrating projections 34 of the contact members 20 penetrate into the contact locations 22 on the wafer 12 to a self limiting penetration depth. This provides a temporary electrical connection between the contact members 20 and the contact locations 22. Test signals can be applied by the testing circuitry 33 associated with the testing apparatus 48 to the integrated circuits formed within the wafer 12 using this temporary electrical connection. In addition, a separation distance can be maintained between the surface of the wafer 12 and the surface of the interconnect 10. This separation distance is approximately equal to the height of the contact members 20 (FIG. 2).

During the test procedure contact forces between the contact members 20 and contact locations 22 can be monitored by the pressure sensing mechanism 52 and transmitted to the controller 58. In addition, the controller 58 (or feed back from the controller 58) can be used to control the testing apparatus 48 to adjust the pressure P (FIG. 3) to achieve desired contact forces as required.

As also shown in FIG. 4, the interconnect 10 can be replaced with a (Vcc-Vss) interconnect 10A. The (Vcc-Vss) interconnect 10A includes contact members 20 (FIG. 2) configured for contacting only the Vcc and Vss contact locations 22 (FIG. 2) for the dice 14 (FIG. 1). Typically each die 14 will include only one Vcc contact location and only one Vss contact location. The Vcc contact locations are the positive power connections to the integrated circuits on the dice 14. The Vss contact locations are the ground connections for the integrated circuits.

The (Vcc-Vss) interconnect 10A thus has substantially fewer contact members 20 than the interconnect 10. For example, an 8" diameter wafer with 500 DRAM dice will require only 1000 contact members (e.g., one Vss contact member and one Vcc contact member per die). In contrast, an SRAM die can have up to 100 or more contact locations per die. Accordingly, to provide electrical connection to all of the contact locations would require up to 25,000 contact members 20. Because the interconnect 10A has substantially fewer contact members 20 than interconnect 10, reduced contact forces are required between the wafer 12 and interconnect 10A.

The (Vcc-Vss) interconnect 10A can be used for some types of testing, such as burn-in, that do not require electrical paths to all of the contact locations 22 on the die 14. On the other hand, the interconnect 10 can be used for other types of testing, such as dynamic burn-in and high speed testing, that require electrical paths to all of the contact locations 22 on the die 14.

Multi Level Conductors

Figure 5A:
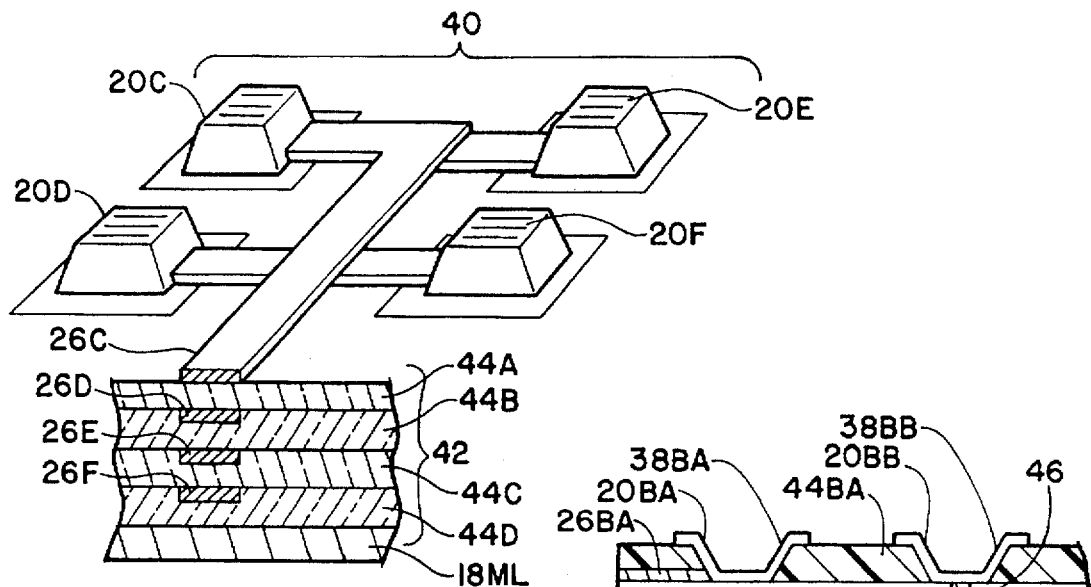
FIG. 5A is a perspective view of a dense array of contact members on the interconnect, with the interconnect substrate cut away illustrating a cross section of multi level conductors for the contact members.
Figure 5B:
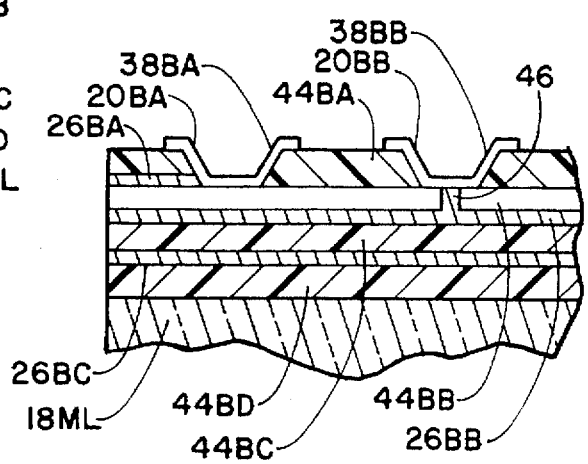
FIG. 5B is an enlarged cross sectional view showing indentation contact members as in FIG. 2B, but with multi level conductors formed on a ceramic substrate.

Referring to FIGS. 5A and 5B, additional details of the interconnect 10 are illustrated. With either embodiment of contact member 20 or 20B, the conductors 26 or 26B can be formed in a multi level configuration to permit electrical paths to dense arrays of contact members. In FIG. 5A, adjacent contact members 20C, 20D, 20E, 20F form a dense array 40 of contact members. The contact members are formed as previously described for contact members 20 (FIG. 2). However, the corresponding multi level conductors 26C, 26D, 26E, 26F for the contact members 20C, 20D, 20E, 20F are formed as a stacked structure 42 on a substrate 18 ML.

The stacked structure 42 also includes multi level insulating layers 44A, 44B, 44C, 44D formed on the substrate 18 ML over and between the multi level conductors 26C, 26D, 26E, 26F as required. The insulating layers 44A, 44B, 44C, 44D electrically insulate the multi level conductors 26C, 26D, 26E, 26F. In addition, the insulating layers 44A, 44B, 44C, 44D help to prevent cross talk and capacitive coupling between the multi level conductors 26C, 26D, 26E, 26F.

As used herein, the term "multi level conductors" means that the conductors 26C, 26D, 26E, 26F are not co-planar to one another but are on different planes. Typically, these different planes are horizontal to one another and to the plane of the front and back sides of the substrate 18 ML. The multi level conductors 26C, 26D, 26E, 26F can be formed using a metallization process in which metal layers are blanket deposited (e.g., CVD), patterned (e.g., photo patterned with resist) and then etched.

The multi level conductors 26C, 26D, 26E, 26F are preferably formed of a highly conductive metal such as aluminum. A representative thickness for the multi level conductors 26C, 26D, 26E, 26F can be from 500 to 3000 Å. The insulating layers 44A, 44B, 44C, 44D can be formed of an electrically insulating material, such as an oxide, nitride or polyimide, using a suitable deposition process (e.g., CVD, spin-on). Depending on the material and deposition process, a thickness of each insulating layer 44A, 44B, 44C, 44D can be from 500 Å to 2 µm or more. Preferably the multi level conductors 26C, 26D, 26E, 26F are embedded in the insulating layers 44A, 44B, 44C, 44D so that electrical isolation is provided in both horizontal and vertical directions.

FIG. 5B illustrates adjacent indentation contact members 20BA, 20BB having multi level conductors 26BA, 26BB, 26BC and stacked insulating layers 44BA, 44BB, 44BC, 44BD. The indentation contact members 20BA, 20BB are substantially similar to the indentation contact member 20B (FIG. 3) previously described. The multi level conductors 26BA, 26BB, 26BC can be formed in electrical communication with conductive layers 38BA, 38BB for the indentation contact members 20BA, 20BB. In this embodiment, conductive vias 46 can be formed through the insulating layers 44BA, 44BB, 44BC, 44BD, as required, to interconnect the multi level conductors 26C, 26D, 26E, 26F to the indentation contact members 20BA, 20BB. The conductive vias 46 can be formed by etching or laser ablating vias in the insulating layers 44BA, 44BB, 44BC, 44BD and filling the vias with metal using electrodeposition or other processes.

Fabrication Process

Figure 6A:
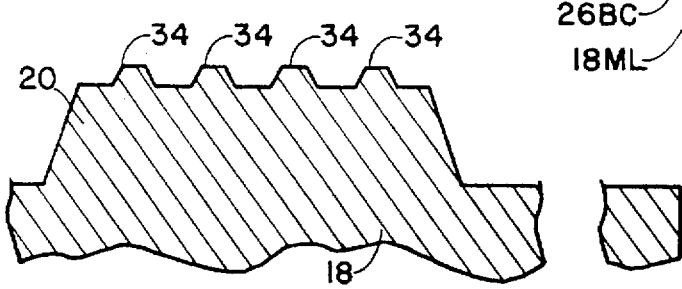
FIGS. 6A–6C are schematic cross sectional views illustrating steps in a fabrication process for fabricating the raised contact member shown in FIGS. 2 and 2A.
Figure 6B:
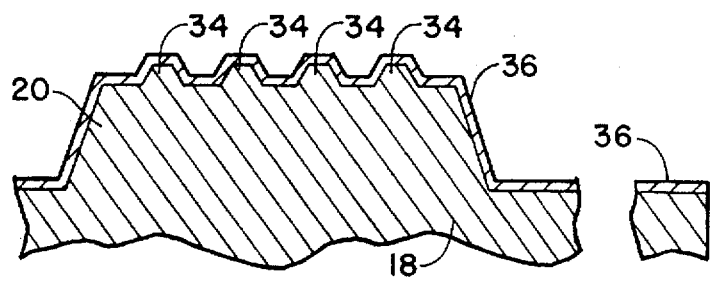
Figure 6C:
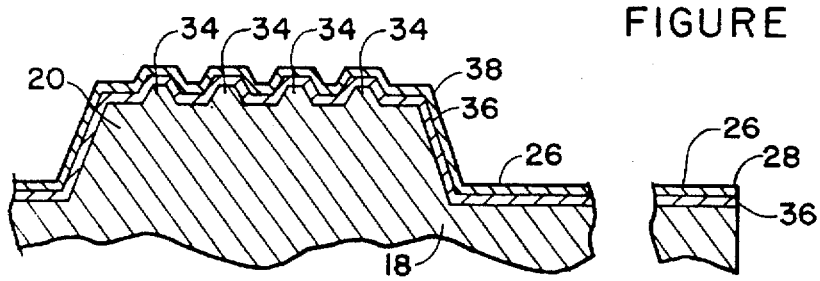

Referring to FIGS. 6A–6C, a process for forming the raised contact members 20 using an etching process is shown. In the process illustrated in FIGS. 6A–6C, the interconnect substrate 18 comprises silicon or other etchable semiconductor material.

Initially, as shown in FIG. 6A, the projections 34 can be formed by forming a mask (not shown) on the substrate 18 and then etching exposed portion of the substrate 18 through the mask. For example, a hard mask can be formed on the substrate 18 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the projections 34. For example, an anisotropic etch can be performed on a substrate 18 formed of silicon using a solution of KOH and $H_2O$. This type of semiconductor fabrication process is sometimes referred to as "bulk micromachining".

The projections 34 can be elongated blades or sharp points formed in locations that match the placement of the contact locations 22 (FIG. 2) on the dice 14. In the illustrative embodiment, there are four projections 34 per contact member 20. However, a greater or lesser number of projections 34 can be formed. In addition, the projections 34 for each contact member 20 are formed in a pattern having an outline contained within the perimeter of the contact locations 22 (FIG. 2) on the dice 14. A representative height for the projections 34 measured from the base to the tip can be from 0.2 to 1 μm. A representative length for the projections 34 measured from end to end can be from 3 to 10 μm.

Once the projections 34 are formed, the hard mask can be stripped and another mask (not shown) can be formed for etching the substrate 18 to form the contact members 20. Using an anisotropic etch process, the contact members 20 are formed as topographically elevated pillars generally conical in shape. A representative height of the contact members 20 from base to tip can be from 50–100 μm. A representative width of each side of the contact members 20 can be from 40–80 μm. Following formation of the contact members 20, the etch mask can be stripped.

Suitable etch processes for forming the contact members 20 and projections 34 substantially as shown in FIG. 6 are also disclosed in U.S. Pat. Nos. 5,326,428; 5,419,807 and 5,483,741 which are incorporated herein by reference.

Referring to FIG. 6B, once the projections 34 and contact members 20 are formed, the insulating layer 36 can be formed over the entire substrate 18 including over the contact members 20 and projections 34. The insulating layer 36 can be a grown or deposited material such as $SiO_2$ or $Si_3N_4$. A representative thickness for the insulating layer 36 can be from 500 Å to 1 μm.

Following formation of the insulating layer 36 and as shown in FIG. 6C, the conductive layers 38 for the contact members 20 can be formed on the insulating layer 36. The conductive layers 38 for all of the contact members 20 can be a same layer of material that has been patterned to cover just the contact members 20 and selected portions of the substrate 18. To form the conductive layers 38, a highly conductive metal can be blanket deposited on the substrate 18 by sputtering or other deposition process. Exemplary metals include aluminum, platinum, palladium, copper, gold and silver or alloys of these metals. A representative thickness for the conductive layers 38 can be from 500 Å to 2 μm.

Following blanket deposition of the conductive metal, a resist mask can be formed and used for etching the conductive metal such that at least a portion of the contact members 20 remain covered with the conductive layers 38. The resist mask can be deposited using a standard photoresist deposition and exposure process. This can include spin deposition, followed by hardening, exposure and development. U.S. Pat. No. 5,609,995 incorporated herein by reference describes a method for patterning a conductive layer using deposited layer of resist.

As an alternative to a metallization process (i.e., deposition resist, mask formation, etching), the conductive layers 38 can be formed as a metal silicide using a process as disclosed in U.S. Pat. No. 5,483,741 incorporated herein by reference.

During formation of the conductive layers 38, the conductors 26 and connection pads 28 can also be formed in electrical communication with the conductive layers 38 using the same material and metallization process used to form the conductive layers 38. Alternately the conductors 26 and connection pads 28 can be formed using different materials and a separate metallization process. For example, the conductors 26 and connection pads 28 can be formed using a process such as plating, thin film deposition or screen printing.

The conductors 26 can also be formed as multi level conductors 26C, 26D, 26E, 26F as shown in FIG. 5A. In this case separate metallization processes can be used to form each layer of multi level conductors. In addition, separate insulating layers 44A, 44B, 44C, 44D (FIG. 5A) can be formed between the multi level conductors 26C, 26D, 26E, 26F using suitable deposition processes (e.g., CVD, spin on).

Testing Procedure

Figure 7:
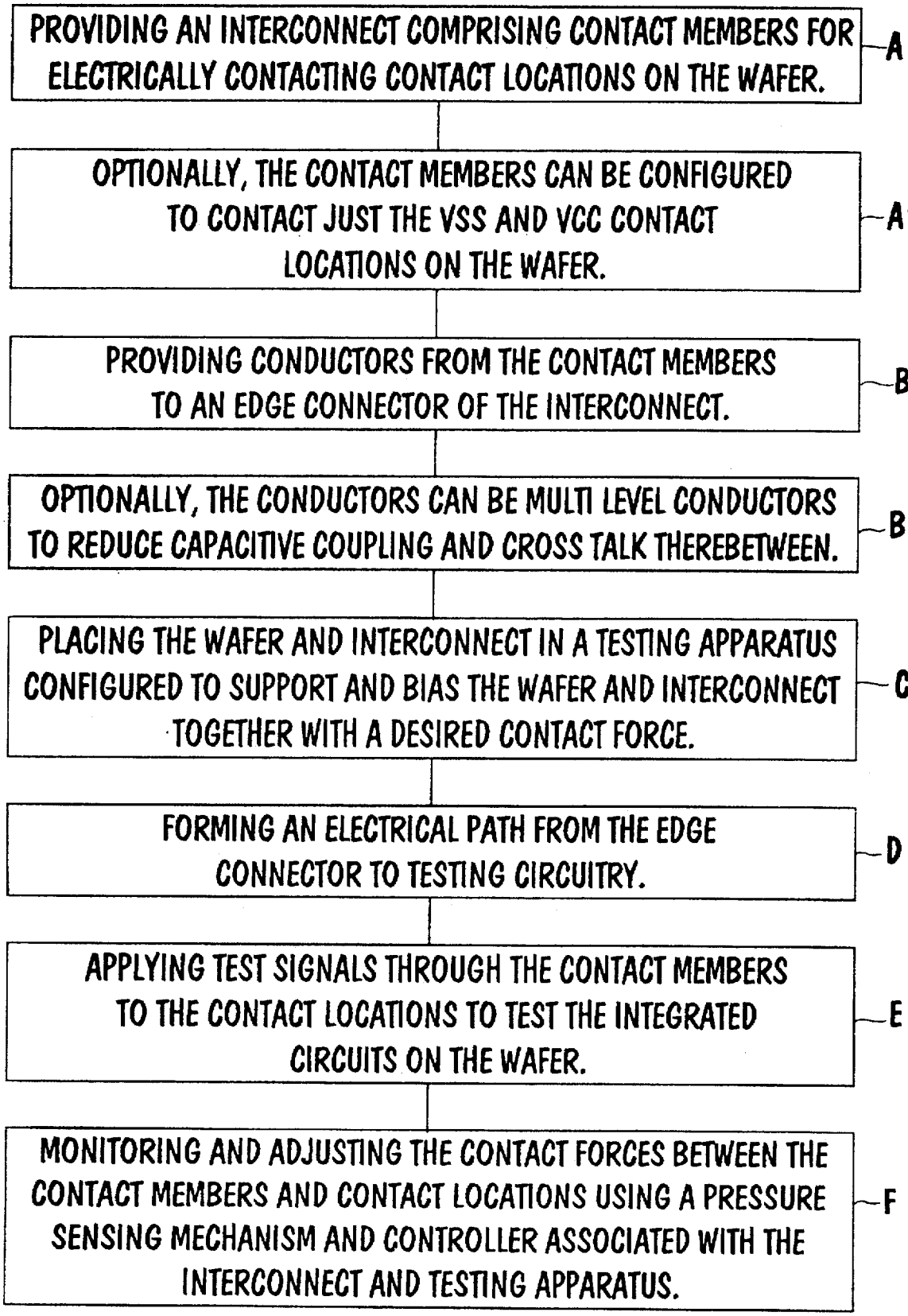
FIG. 7 is a block diagram of a method for testing a semiconductor wafer in accordance with the invention.

Referring to FIG. 7, broad steps in a method for testing a semiconductor wafer in accordance with the invention are shown. These steps are as follows:

A. Providing an interconnect comprising contact members for electrically contacting contact locations on the wafer. For wafers with flat contact locations, the contact members can include penetrating projections and a conductive layer. For wafers with bumped contact locations, the contact members can include indentations and conductive layers.

A1. Optionally, the contact members can be configured to contact just the Vss and Vcc contact locations on the wafer.

B. Providing conductors from the contact members to an edge connector of the interconnect.

B1. Optionally, the conductors can be multi level conductors to reduce capacitive coupling and cross talk therebetween.

C. Placing the wafer and interconnect in a testing apparatus configured to support and bias the wafer and interconnect together with a desired contact force.

D. Forming an electrical path from the edge connector to testing circuitry.

E. Applying test signals through the contact members to the contact locations to test the integrated circuits on the wafer.

F. Monitoring and adjusting the contact forces between the contact members and contact locations using a pressure sensing mechanism and controller associated with the interconnect.

Thus the invention provides an improved interconnect for semiconductors wafers, a method for testing using the interconnect, and a method for fabricating the interconnect. While the invention has been described with reference to certain preferred embodiments, as will be apparent to those skilled in the art, certain changes and modifications can be made without departing from the scope of the invention as defined by the following claims.

What is claimed is:

1. An interconnect for a semiconductor wafer comprising:
   a substrate;
   a contact member on the substrate configured to form a temporary electrical connection with a contact location on the wafer; and
   a pressure sensing mechanism associated with the substrate configured to sense a contact force between the contact member and the contact location.

2. The interconnect as claimed in claim 1 wherein the pressure sensing mechanism comprises a piezoresistive or piezoelectric layer and a resistance measuring device.

3. The interconnect as claimed in claim 1 and further comprising a controller associated with the pressure sensing mechanism for adjusting the contact force.

4. The interconnect as claimed in claim 1 wherein the pressure sensing mechanism comprises a microsensor embedded in a base.

5. The interconnect as claimed in claim 1 wherein the contact member includes a penetrating projection configured to penetrate the contact location to a limited penetration depth.

6. The interconnect as claimed in claim 1 wherein the contact location comprises a bump and the contact member includes an indentation for retaining the bump.

7. An interconnect for a semiconductor wafer comprising:
 a substrate comprising a contact member configured to establish a temporary electrical connection with a contact location on the wafer;
 a piezoresistive or piezoelectric layer proximate to the substrate in electrical communication with a resistance measuring device configured to measure a change in resistance in the layer responsive to a pressure exerted on the substrate; and
 a controller in electrical communication with the resistance measuring device configured to equate the change in resistance to a contact force between the contact member and the contact location.

8. The interconnect as claimed in claim 7 wherein the resistance measuring device comprises a Wheatstone bridge.

9. The interconnect as claimed in claim 7 wherein the controller provides feedback to a testing apparatus configured to adjust the pressure.

10. The interconnect as claimed in claim 7 wherein the layer comprises a plurality of segments, each said segment associated with a group of contact members on the substrate.

11. An interconnect for a semiconductor wafer comprising:
 a substrate;
 a plurality of contact members formed on the substrate configured to establish electrical communication with contact locations on the wafer; and
 a pressure sensing mechanism mounted to the substrate for sensing contact forces between the wafer and the substrate, said mechanism comprising a plurality of piezoresistive or piezoelectric segments corresponding to selected areas on the wafer, said mechanism further comprising a resistance measuring device configured to measure changes in resistance in the segments responsive to changes in the contact forces.

12. The interconnect as claimed in claim 11 wherein each die on the wafer has an associated piezoresistive or piezoelectric segment.

13. The interconnect as claimed in claim 11 wherein each segment has a plurality of contacts configured as a Wheatstone bridge.

14. The interconnect as claimed in claim 11 wherein the contact members are configured to establish electrical communication with Vss and Vcc contact locations on the wafer.

15. An interconnect for a semiconductor wafer comprising:
 a substrate;
 a contact member formed on the substrate configured to establish temporary electrical communication with a contact location on the wafer;
 a piezoresistive or piezoelectric segment configured to measure a pressure exerted on the substrate, said segment corresponding to a die on the wafer;
 a first and a second conductive trace in electrical communication with the segment for applying a voltage thereto;
 a resistance measuring device for measuring a change in resistance across the segment; and
 a controller in electrical communication with the resistance measuring device, said controller configured to equate the change in resistance to the pressure.

16. The interconnect as claimed in claim 15 further comprising a plurality of segments corresponding to each die on the wafer.

17. The interconnect as claimed in claim 15 wherein the segment comprises a semiconductor material.

18. The interconnect as claimed in claim 15 wherein the segment includes a plurality of contacts formed as a Wheatstone bridge.

19. An interconnect for a semiconductor wafer comprising:
 a substrate;
 a plurality of contact members formed in the substrate comprising raised members covered with conductive layers, said contact members configured to penetrate into contact locations on the wafer to limited penetration depths to establish temporary electrical communication therewith;
 a plurality of multi level conductors formed on the substrate in electrical communication with the conductive layers and separated by a plurality of insulating layers; and
 a pressure sensing mechanism comprising a piezoresistive or piezoelectric layer in contact with a backside of the substrate configured to measure a contact force between the contact members and the contact locations.

20. The interconnect as claimed in claim 19 wherein the contact members are configured to contact just the Vcc and Vss contact locations on the wafer.

21. The interconnect as claimed in claim 19 and further comprising a controller operably associated with the pressure sensing mechanism for adjusting the contact force.

22. The interconnect as claimed in claim 19 wherein the pressure sensing mechanism includes a resistance measuring device for measuring a change of resistance in the layer.

23. An interconnect for a semiconductor wafer comprising:
 a substrate;
 a plurality of contact members formed in the substrate comprising indentations covered with conductive layers, said indentations configured to retain bumped contact locations on the wafer while the conductive layers establish temporary electrical communication therewith; and
 a pressure sensing mechanism comprising a piezoresistive or piezoelectric layer in contact with a backside of the substrate configured to measure a contact force between the contact members and the contact locations.

24. The interconnect as claimed in claim 23 wherein the contact members are configured to contact just the Vcc and Vss contact locations on the wafer.

25. The interconnect as claimed in claim 23 and further comprising a controller operably associated with the pressure sensing mechanism for adjusting the contact force.

26. The interconnect as claimed in claim 23 wherein the pressure sensing mechanism includes a resistance measuring device for measuring a change of resistance in the layer.

* * * * *